US010958195B2

(12) United States Patent
Nomura et al.

(10) Patent No.: US 10,958,195 B2
(45) Date of Patent: Mar. 23, 2021

(54) CONTROL DEVICE AND CONTROL METHOD FOR LINEAR MOTOR (71) Applicant: THK CO., LTD., Tokyo (JP)

(72) Inventors: Yuki Nomura, Tokyo (JP); Tsuyoshi Inda, Tokyo (JP); Hideya Nakayama, Tokyo (JP)

(73) Assignee: THK CO., LTD., Tokyo (JP)

( * ) Notice: Subject to any disclaimer, the term of this patent is extended or adjusted under 35 U.S.C. 154(b) by 17 days.

(21) Appl. No.: 16/068,728

(22) PCT Filed: Jan. 10, 2017

(86) PCT No.: PCT/JP2017/000458
§ 371 (c)(1),
(2) Date: Jul. 9, 2018

(87) PCT Pub. No.: WO2017/122628
PCT Pub. Date: Jul. 20, 2017

(65) Prior Publication Data
US 2019/0028042 A1    Jan. 24, 2019

(30) Foreign Application Priority Data
Jan. 14, 2016   (JP) .............................. JP2016-005321

(51) Int. Cl.
H02J 1/00        (2006.01)
H02P 6/00        (2016.01)
(Continued)

(52) U.S. Cl.
CPC .............. H02P 6/006 (2013.01); B65G 47/91 (2013.01); H01L 21/67144 (2013.01);
(Continued)

(58) Field of Classification Search
USPC .................................................... 318/135, 34
See application file for complete search history.

(56) References Cited

U.S. PATENT DOCUMENTS 5,729,111 A * 3/1998 Ogura .................... G05D 19/02
                                                      318/623
2004/0150265 A1* 8/2004 Gotzenberger ....... H02M 3/156
                                                      307/11
(Continued)

FOREIGN PATENT DOCUMENTS

CN          103154688 A      6/2013
EP            2631622 A1     8/2013
(Continued)

OTHER PUBLICATIONS

International Search Report dated Apr. 4, 2017, issued in counterpart International Application No. PCT/JP2017/000458, w/English translation (4 pages).
(Continued)

Primary Examiner — Eduardo Colon Santana
Assistant Examiner — Zemenay T Truneh
(74) Attorney, Agent, or Firm — Westerman, Hattori, Daniels & Adrian, LLP (57) ABSTRACT A control device for a linear motor is disclosed which is provided with a current limiter and a driver. The current limiter outputs either a target current value or a limiting current command value. When the target current value is output as the current command value, the driver applies a voltage to the linear motor based of the value obtained by multiplying a first proportional gain by the difference between the current value of the current flowing to the linear motor and the current command value. When the limiting current command value is output as the current command value, the driver applies a voltage to the linear motor based of the value obtained by multiplying a second proportional gain, which is greater than the first proportional gain, by the difference between the current value of the current flowing to the linear motor and the limiting current command value.

5 Claims, 6 Drawing Sheets (51) Int. Cl.
*H02K 41/02* (2006.01)
*H02P 29/40* (2016.01)
*H02P 6/08* (2016.01)
*H02P 6/28* (2016.01)
*B65G 47/91* (2006.01)
*H01L 21/67* (2006.01)
*H02P 6/16* (2016.01)

(52) U.S. Cl.
CPC .............. *H02K 41/02* (2013.01); *H02P 6/08* (2013.01); *H02P 6/16* (2013.01); *H02P 6/28* (2016.02); *H02P 29/40* (2016.02)

(56) References Cited

U.S. PATENT DOCUMENTS

2014/0253010 A1  9/2014  Ikai
2014/0333236 A1* 11/2014  Yamanaka .............. H02P 25/06
                                                    318/135
2016/0072419 A1  3/2016  Yamada et al.

FOREIGN PATENT DOCUMENTS

| | | |
|---|---|---|
| JP | 8-309620 A | 11/1996 |
| JP | 2005-37998 A | 2/2005 |
| JP | 2013-141386 A | 7/2013 |
| JP | 2014-171360 A | 9/2014 |
| TW | 201219811 A | 5/2012 |
| TW | 201446572 A | 12/2014 |
| WO | 2007/126024 A1 | 11/2007 |

OTHER PUBLICATIONS

Office Action dated Dec. 2, 2020, issued in counterpart CN Application No. 2017800053091, with English translation (8 pages).
Office Action dated Dec. 22, 2020, issued in counterpart TW Application No. 106100940, with English translation (6 pages).

* cited by examiner

CONTROL DEVICE AND CONTROL METHOD FOR LINEAR MOTOR

TECHNICAL FIELD

The present invention relates to a control device and a control method of a linear motor.

Priority is claimed on Japanese Patent Application No. 2016-005321, filed Jan. 14, 2016, the content of which is incorporated herein by reference.

BACKGROUND ART

In a mounting apparatus for mounting work such as an electronic part on a substrate and a machine apparatus for processing a work to be processed, a servo-controlled linear motor is used as a means for vertically moving a head portion which is in contact with or adjacent to the work. In such a mounting apparatus or a machine apparatus, in order to reduce a force applied to the work, a balancing balancer corresponding to a weight of the head part may be used (Patent Document 1). In addition, in order to reduce the force applied to the work due to contact with the head portion, a constitution in which the linear motor is driven while reducing a thrust when the head portion is moved toward the work may be adopted. In a case where the thrust generated by the linear motor is small, a movement of the head portion may be hindered by a sliding resistance or the like of a movable portion in the mounting apparatus or the machine apparatus, the head portion may stop, or time may be required for moving the head portion. Therefore, there is a possibility that an operation will not be stable.

CITATION LIST

Patent Document

[Patent Document 1]
Japanese Unexamined Patent Application, First Publication No. H08-309620

SUMMARY OF INVENTION

Technical Problem

The present invention provides a control device and a control method of a linear motor, capable of stably operating a linear motor, even in a case where force, such as a sliding resistance of a movable portion, inhibiting a movement acts when the linear motor is controlled while suppressing the thrust.

Solution to Problem

According to a first aspect of the present invention, a control device of a linear motor includes a current limiter and a driver. The current limiter outputs either a target current value, which is calculated on the basis of a position of a movable element provided at the linear motor and a position command value, or a limit current command value in which in which the target current value is limited within a designated range as a current command value on the basis of the position of the movable element. The driver applies a voltage to the linear motor on the basis of a value obtained by multiplying a difference between a current value of a current flowing through the linear motor and the current command value by a first proportional gain in a case where the target current value is output as the current command value, and applies a voltage to the linear motor on the basis of a value obtained by multiplying a difference between the current value of the current flowing through the linear motor and the limit current command value by a second proportional gain greater than the first proportional gain in a case where the limit current command value is output as the current command value.

According to a second aspect of the present invention, the second proportional gain may be a value equal to or less than a value at which continuous oscillation occurs in the current value of the current flowing through the linear motor.

According to a third aspect of the present invention, the second proportional gain may be set on the basis of a value $|G_0(j\omega)|$ given by an angular velocity $\omega$ at which a phase angle $\angle G_0(j\omega)$ is $-\pi$[rad] when a transfer function of a feedback control system is $G_0(s)$ in a feedback control system including the driver and the linear motor.

According to a fourth aspect of the present invention, the linear motor may be used for pressing an object. In a case where the limit current command value is output from the current limiter, the driver may determine whether or not pressing of the object has started based on the current value of the current flowing through the linear motor and a moving speed of the movable element, and in a case where the driver determines that the pressure of the object is started, the driver may apply the voltage obtained by multiplying the difference between the current value of the current flowing through the linear motor and the limit current command value by the first proportional gain to the linear motor.

According to a fifth aspect of the present invention, a control method performed by a control device of a linear motor, including a current limiter configured to output one of a target current value calculated on the basis of a position of a movable element provided at the linear motor and a position command value, and a limit current command value for suppressing the target current value to be within a predetermined range as a current command value on the basis of the position of the movable element includes a step of applying a voltage to the linear motor on the basis of a value obtained by multiplying a difference between a current value of a current flowing through the linear motor and the current command value by a first proportional gain in a case where the target current value is output as the current command value, and applying the voltage to the linear motor on the basis of a value obtained by multiplying a difference between the current value of the current flowing through the linear motor and the limit current command value by a second proportional gain greater than the first proportional gain in a case where the limit current command value is output as the current command value.

Advantageous Effects of Invention

According to the control device and the control method of the linear motor described above, it is possible to stably operate a linear motor, even in a case where force inhibiting a movement such as a sliding resistance of a movable portion acts when the linear motor is controlled while suppressing a thrust.

DESCRIPTION OF EMBODIMENTS

Figure 1:
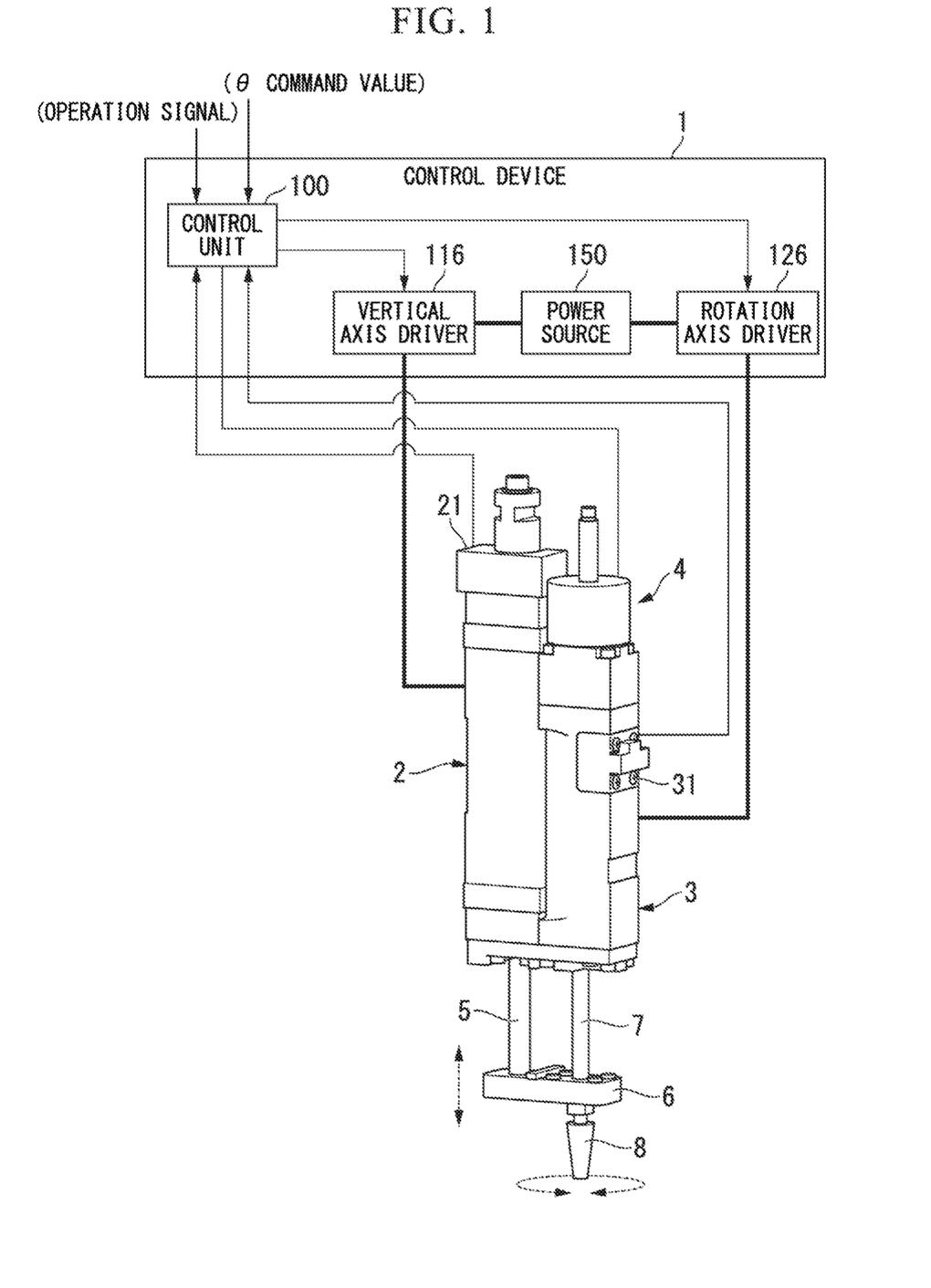
FIG. 1 is a diagram illustrating an outline of a linear actuator in an embodiment of the present invention.

Hereinafter, a control device and a control method of a linear motor in an embodiment of the present invention will be described with reference to the drawings. FIG. 1 is a diagram illustrating an outline of a linear actuator in the present embodiment. The linear actuator is used as, for example, a transport device, a pick-and-place device, a semiconductor processing device, and the like. The linear actuator has a control device 1, a linear motion device 2, a rotation device 3, and a brake device 4.

The linear motion device 2 has a linear motor. The linear motion device 2 linearly moves a rod 5 that is a movable element of the linear motor. A connection plate 6 is fixed to a tip of the rod 5. The rotation device 3 has a rotary motor. The rotation device 3 rotates the rod 7, which is a movable element of the rotary motor, about a central axis of the rod 7. The rod 7 is connected to the connection plate 6 so as to be rotatable through a bearing (not shown) provided on the connection plate 6. The rod 7 is supported by a spline device (linear motion guide device) (not shown) provided inside the rotation device 3. The rod 7 may perform a rotation motion and a rectilinear motion.

A suction pad 8 is attached to a tip of the rod 7, as an application device. In addition, instead of the suction pad 8, another tool may be attached to the tip of the rod 7.

For example, the suction pad 8 may suction a work (object) by using a negative pressure generated in an external device and desorb the work by using a positive pressure generated in the device. The suction pad 8 is moved in an axial direction along the central axis of the rod 7 by the linear motion device 2. That is, in a case where the rod 5 moves in an axial direction of the rod 5 by the linear motion device 2, the rod 7 is moved together with the rod 5 in the axis direction by the connection plate 6 and a position of the suction pad 8 is displaced in the axis direction of the rod 7.

The brake device 4 stops the movement of the rod 7 in the axial direction. The brake device 4 of the present embodiment is attached to the rotation device 3. In the present embodiment, the axial direction of the rod 5 and the axial direction of the rod 7 are parallel and coincide with a direction of gravity. For example, the linear actuator in the present embodiment is used in a chip mounter. In the chip mounter, the suction pad 8 is moved up and down by the linear motion device 2, and thereby repeats a process of picking up an electronic part or the like as a work and pressing the electronic part into a predetermined position on a substrate. The thrust generated by the linear motor of the linear motion device 2 is also used in pressing the electronic part. Before pressing the electronic part to the predetermined position on the substrate, the rotation device 3 rotates the suction pad 8 in the axial direction of the rod 7 according to a direction of attachment of the electronic part to the substrate.

The control device 1 controls the linear motor included in the linear motion device 2, the rotary motor included in the rotation device 3, and the brake device 4. The control device 1 generates an electromagnetic field by causing a three phase armature current to flow through U, V, W phase coils provided at the linear motor, and linearly moves the rod 5, which is the movable element of the linear motor, with respect to a stator. The control device 1 supplies the three phase armature current to the linear motor on the basis of an input operation signal. In addition, the control device 1 moves a rotation position of the rod 7 such that an angle of the rotation position with respect to the reference position becomes an angle indicated by a θ command value by rotating the rotary motor on the basis of the input θ command value.

The control device 1 includes a control unit 100, a vertical axis driver 116, a rotation axis driver 126, and a power source 150. The control unit 100 calculates a current command value on the basis of a vertical pulse signal and an operation signal output from an encoder 21 attached to the linear motion device 2. The control unit 100 outputs the calculated current command value to the vertical axis driver 116.

The vertical axis driver 116 calculates a current deviation that is a difference between the current command value input from the control unit 100 and a current value of a current flowing through the linear motor. For example, the current value of the current flowing through the linear motor is measured by using a current transformer provided in the vertical axis driver 116. The vertical axis driver 116 calculates a target voltage value to be applied to the linear motor by PI control which uses the calculated current deviation. The vertical axis driver 116 calculates the target voltage value by adding a value obtained by multiplying an integral value of the current deviation by an integral gain Ki and a value obtained by multiplying the current deviation by a proportional gain Kp. That is, the vertical axis driver 116 performs a feedback control that is a combination of a proportional operation for changing the voltage value in proportion to the current deviation and an integral operation for changing the voltage value in proportion to the integral value of the current deviation. In addition, in the calculation of the target voltage value in the vertical axis driver 116, a PID control in which a differentiation operation for changing the voltage value in proportion to a differentiated value of the current deviation is further included may be used. The vertical axis driver 116 converts a voltage supplied from the power source 150 to a voltage of the calculated target voltage value and applies the voltage to the linear motor. The control unit 100 drives the linear motor by supplying power to the linear motor through the vertical axis driver 116 and moves the suction pad 8 up and down.

In addition, the control unit 100 calculates the current command value on the basis of the θ command value and a rotation pulse signal output from an encoder 31 that is attached to the rotation device 3. The control unit 100 outputs the calculated current command value to the rotation axis driver 126. The rotation axis driver 126 converts a uniform voltage supplied from the power source 150 on the basis of the current command value and applies the converted voltage to the rotary motor. The control unit 100 drives the rotary motor by supplying power to the rotary motor through the rotation axis driver 126 and rotates the rod 7 and the suction pad 8.

Figure 2:
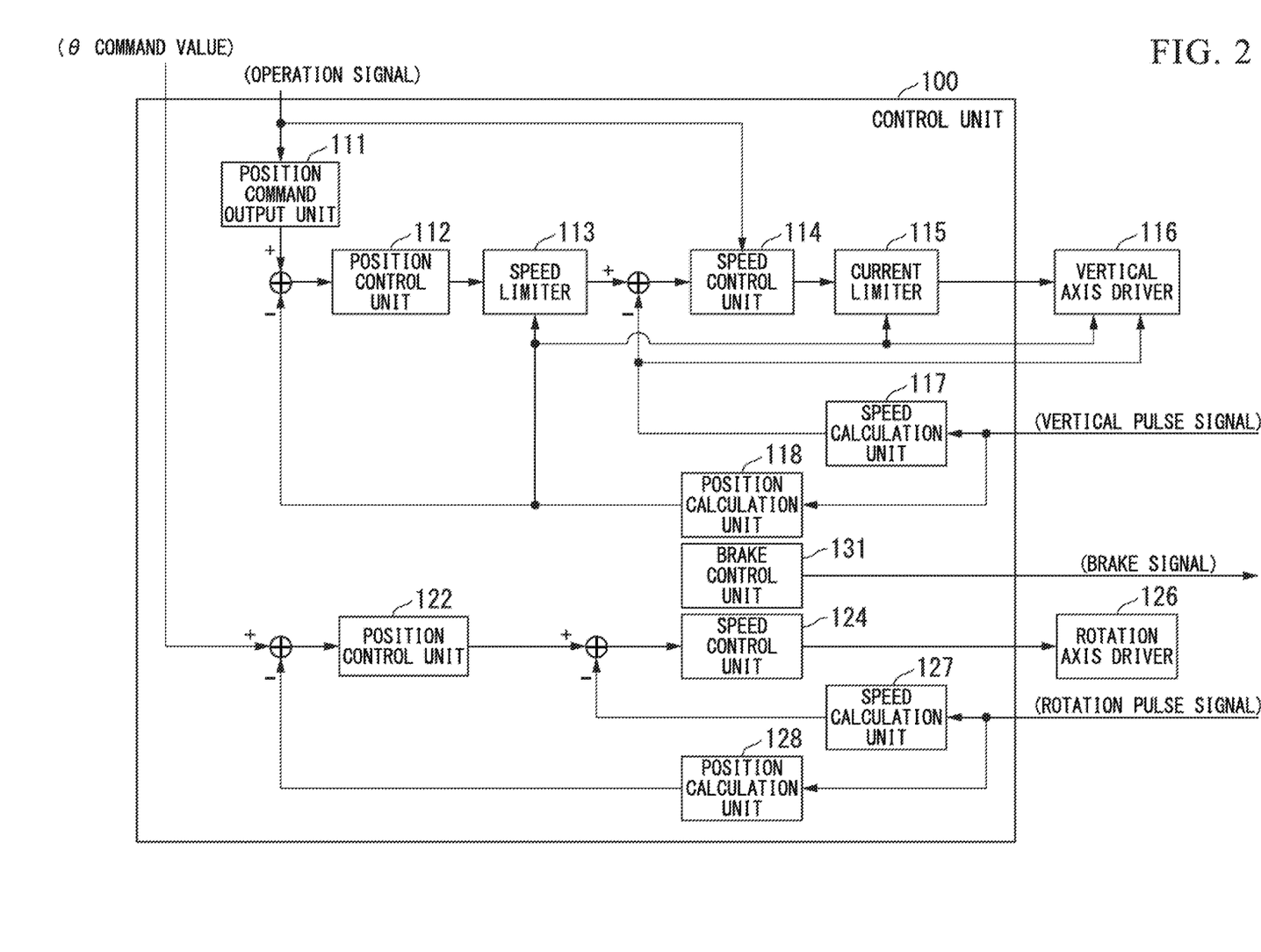
FIG. 2 is a block diagram illustrating a constitution example of a control unit in an embodiment of the present invention.

FIG. 2 is a block diagram illustrating a constitution example of the control unit 100 in the present embodiment. The control unit 100 includes a position command output unit 111, a position control unit 112, a speed limiter 113, a speed control unit 114, a current limiter 115, a speed calculation unit 117, a position calculation unit 118, a position control unit 122, a speed control unit 124, a speed calculation unit 127, a position calculation unit 128, and a brake control unit 131.

The position command output unit 111 outputs a position command value determined one of an origin position and a pressing position as a target position in accordance with the input operation signal. For example, the origin position is set as a position at which the rod 5 of the linear motor is set at an uppermost position or a position in the vicinity of the uppermost position. The pressing position is set to a position of the rod 5 of the linear motor when the work is pressed on the substrate in a state in which the suction pad 8 holds the work. The position command output unit 111 outputs the position command value in which the origin position is the target position when the operation signal indicates a movement to the origin position and outputs the position command value in which the pressing position is the target position when the operation signal indicates a movement to the pressing position. In the following description, when the operation signal indicates movement to the origin position, this is described as the operation signal being off, and when the operation signal indicates the movement to the pressing position, it is described that the operation signal is on.

The position control unit 112 inputs a position deviation. The position deviation is a difference between the position command value output from the position command output unit 111 and a position of the rod 5 calculated by the position calculation unit 119. The position control unit 112 calculates a target speed of the rod 5 by a PI control or a PID control that use the input position deviation. The position control unit 112 outputs the calculated target speed as a speed command value.

In a case where an absolute value of a speed command value calculated by the position control unit 112 is greater than a predetermined upper limit value, the speed limiter 113 suppresses and outputs the speed command value. The upper limit value includes two upper limits which are a first upper limit and a second upper limit. The first upper limit value is an upper limit value when the rod 5 moves between the origin position and a switch position and is a maximum speed at which the rod 5 of the linear motor is able to be driven. The second upper limit value is an upper limit value when the rod 5 moves between the switch position and the pressing position and is a speed at which the force applied to the work is equal to or less than a predetermined value when the suction pad 8 comes into contact with the work and when the work held by the suction pad 8 comes into contact with the substrate. The speed limiter 113 switches between the first upper limit value and the second upper limit value on the basis of the position of the rod 5 calculated by the position calculation unit 119.

The switch position is a position at which position control and thrust control are switched between. The switch position is a predetermined position between the origin position and the pressing position and is set according to a distance required for reducing a speed of the rod 5 from the maximum speed to the speed indicated by the second upper limit value. In the position control, a control based on the deviation between the target position and the position of the rod 5 is performed. In the thrust control a control limited the thrust generated in the linear motor to a thrust equal to or less than a predetermined value is performed. Through switching between position control and the thrust control, it is possible to shorten a tact time and avoid collision with a work or the like. In addition, the switch position when the rod 5 moves up and the switch position when the rod 5 moves downward may be different from each other.

The speed control unit 114 inputs a speed deviation. The speed deviation is a difference between the speed command value output from the speed limiter 113 and the speed of the rod 5 calculated by the speed calculation unit 117. The speed control unit 114 calculates the target current value for flow through the linear motor by the PI control or the PID control that use the input speed deviation. The speed control unit 114 outputs the calculated target current value to the current limiter 115.

In a case where the absolute value of the target current value calculated by the speed control unit 114 is greater than a predetermined current threshold value in the threshold control, the current limiter 115 outputs a current command value in which the target current value is suppressed to the current threshold value. Similarly to the second upper limit value for the speed command value, the current threshold value is set to a current value at which the force applied to the work is equal to or less than a predetermined value when the suction pad 8 comes into contact with the work and when the work held by the suction pad 8 comes into contact with the substrate. In the position control, the current limiter 115 outputs the target current value calculated by the speed control unit 114 as it is to the vertical axis driver 116 as the current command value. That is, the current limiter 115 selects one of the limit current command value that suppresses the target current value within a range set by the current threshold value and the target current value according to the position of the rod 5, and outputs the selected value as the current command value to the vertical axis driver 116.

The speed calculation unit 117 calculates the speed at which the rod 5 moves on the basis of the vertical pulse signal output from the encoder 21 provided at the linear motor of the linear motion device 2. The position calculation unit 118 calculates the position of the rod 5 on the basis of the vertical pulse signal. The encoder 21 may use either an incremental type or an absolute type. In a case where the encoder 21 is the incremental type, an origin return that moves the rod 5 to a predetermined origin position (reference position) is performed after driving of the linear motor is started.

The brake control unit 131 turns on the brake device 4 in order to prevent the rod 5 from moving to the lowest point due to gravity or to prevent the rod 5 from moving due to external force while a drive of the linear motor from stopping to starting. When a servo control based on the position command value is started, the brake control unit 131 turns off the brake device 4.

The position control unit 122 inputs a rotation position deviation. The rotation position deviation is a difference between the rotation position indicated by the input θ command value and the rotation position of the rod 7 calculated by the position calculation unit 129. The position control unit 122 calculates a target rotation speed of the rod 7 by the PI control or the PID control using the input position deviation. The position control unit 122 outputs the calculated target rotation speed as the speed command value.

The speed control unit 124 inputs a rotation speed deviation. The rotation speed deviation is a difference between the speed command value calculated by the position control unit 122 and a rotation speed of the rod 7 calculated by the speed calculation unit 127. The speed control unit 124 calculates the target current value by the PI control or the PID control using the input rotation speed deviation. The speed control unit 124 outputs the calculated target current value as the current command value to the rotation axis driver 126.

The speed calculation unit 127 calculates a rotation speed of the rod 7 on the basis of the rotation pulse signal output from the encoder 31 provided at the rotary motor of the rotation device 3. The position calculation unit 129 calculates the rotation position of the rod 7 on the basis of the rotation pulse signal. The encoder 31 may use any of an incremental type or an absolute type. In a case where the encoder 31 is the incremental type, an origin return that rotates the rod 7 to a predetermined origin position (reference rotation position) is performed after driving the linear motor is started.

Figure 3:
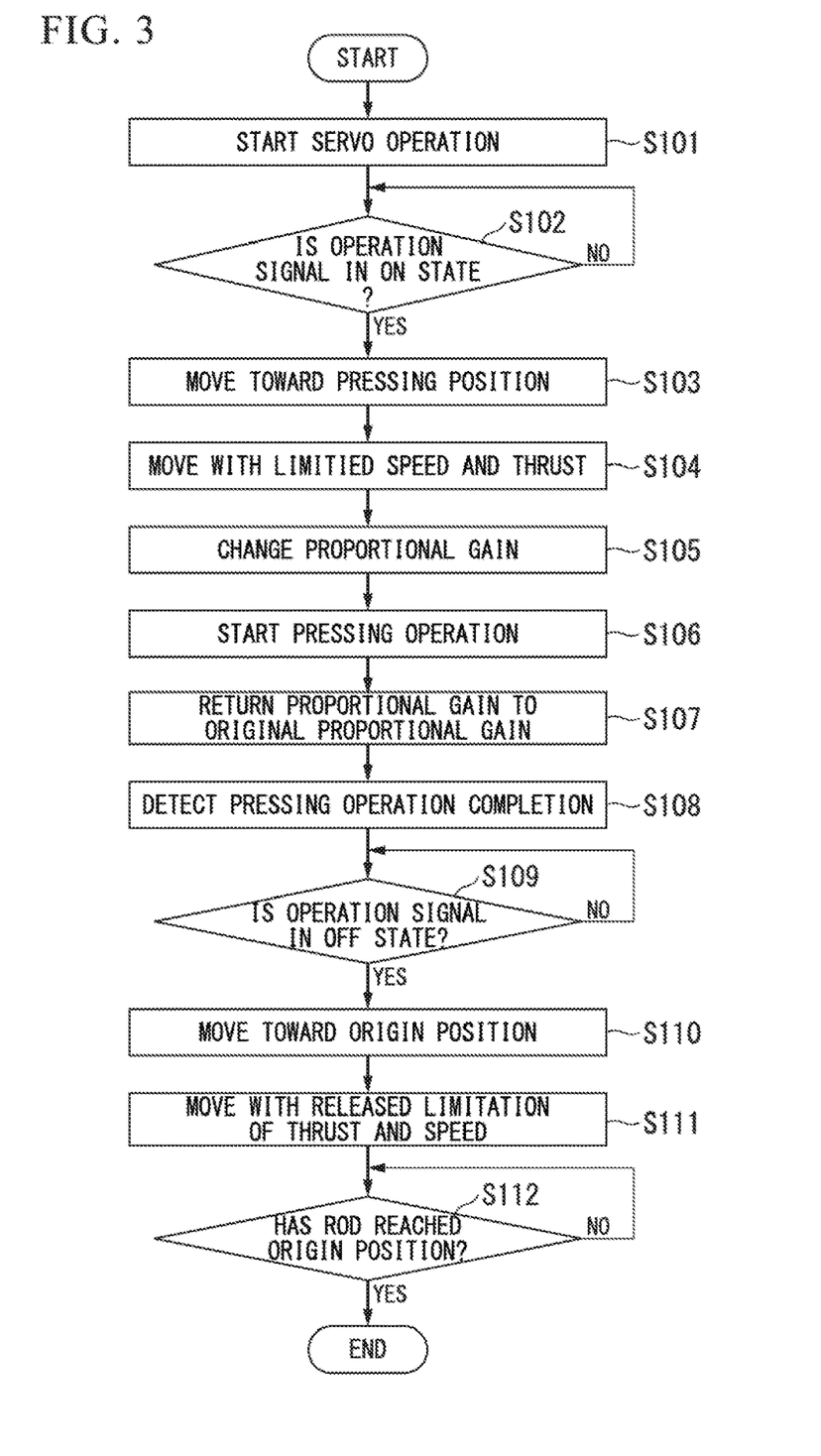
FIG. 3 is a flowchart illustrating control when an operation of picking up a work or pressing the work on a substrate is performed by using the linear actuator.

FIG. 3 is a flowchart illustrating a control when an operation of picking up the work or pressing the work on the substrate is performed by using the linear actuator. In a case where the operation is started by such as supplying a power to the linear actuator, in the control unit 100, the servo operation based on the vertical pulse signal and the rotation pulse signal output from the encoders 21 and 31 is started (step S101). The position command output unit 111 determines whether or not the operation signal is in an on state (step S102), and waits until the operation signal is in an on state (step S102: NO).

In a case where the operation signal is in the on state (step S102: YES), the position command output unit 111 outputs the position command value in which the pressing position is the target position, and starts the operation of moving the rod 5 downward toward the pressing position (step S103). In a case where the rod 5 moves downward beyond the position for switching from the position control to the thrust control the speed limiter 113 and the current limiter 115 suppress the speed command value and the current command value. The control in which the movement speed of the rod 5 and the thrust applied to the rod 5 are limited is performed, by suppressing the speed command value and the current command value (step S104).

The vertical axis driver 116 changes the proportional gain Kp in the proportional operation from the first proportional gain to the second proportional gain in accordance with a switching from the thrust control (step S105). The first proportional gain is a value used in the position control. A value suitable for shortening time required in the movement such that the movement speed of the movable element rapidly increases to the maximum speed in the movement of the movable element from the origin position to the switch position and the movement of the movable element from the switch position to the origin position is set as the first proportional gain.

The second proportional gain is a value greater than the first proportional gain. The second proportional gain is a value equal to or less than a value at which a continuous oscillation occurs in the current value of the current flowing through the linear motor.

Specifically, the second proportional gain is set on the basis of a value $|G_0(j\omega)|$ given by an angular velocity co at which a phase angle $\angle G_0(j\omega)$ is $-\pi$[rad] when a transfer function of a feedback control system is $G_0$ (s) in a feedback control system including the vertical axis driver 116 and the linear motor. That is, the second proportional gain is a value at which the current becomes unstable by occurring the continuous oscillation in the current flowing through the linear motor, and it takes a considerably long time until the current value converges to the current command value. In addition, a value at which the current value does not converge to the current command value and the current value vibrates and is in an unstable state, in the time from the position of the rod 5 reaching the switch position to the suction pad 8 coming into contact with the work or the work held by the suction pad 8 coming into contact with the substrate, may be set as the second proportional gain. That is, a value at which the above-described feedback control system reaches a stability limit may be set as the second proportional gain.

In a case where the rod 5 moves downward by the thrust control, the rod 7 and the suction pad 8 move together with the rod 5, and the fact that the suction pad 8 comes into contact with the work or the work held by the suction pad 8 comes into contact with the substrate is detected on the basis of change in the current value of the current flowing through the linear motor and the movement speed and the position of the rod 5, a pressing operation is started (step S106).

The pressing operation is an operation of pressing the suction pad 8 on the work or pressing the work held by the suction pad 8 on the substrate by the thrust of the linear motor. In addition, the control device 1 may output a signal notifying an external device of the start of the pressing operation.

In addition, in a case where the fact that the suction pad 8 comes into contact with the work or the work held by the suction pad 8 comes into contact with the substrate is detected on the basis of change in the current value of the current flowing through the linear motor and the movement speed and the position of the rod 5, the vertical axis driver 116 returns the proportional gain Kp in the proportional operation from the second proportional gain to the first proportional gain (step S107). For example, in a case where the current value of the current flowing through the linear motor reaches a pressure current value and the movement speed of the rod 5 calculated by the speed calculation unit 117 is substantially zero, the vertical axis driver 116 may determines that the suction pad 8 has come into contact with the work or the work held by the suction pad 8 has come into contact with the substrate, that is, the pressing operation has started. The movement speed of substantially zero means that a case where the movement speed is within a speed range, which includes zero, in which it is regarded that the rod 5 has stopped.

In addition, the vertical axis driver 116 may use the position of the rod 5 calculated by the position calculation unit 118 in determining whether or not the pressing operation has started.

In a case where a predetermined time elapses from the start of the pressing operation and the pressing operation is completed (step S108), the position command output unit 111 determines whether or not the operation signal is in the off state (step S109) and waits until the operation signal is in the off state (step S109: NO). In addition, the time elapsed from the start of the pressing operation may be measured by using a timer provided in the control unit 100. Alternatively, the start of the pressing operation may be notified to the external device and the time elapsed from the start of the pressing operation may be acquired from the external device. In addition, the control device 1 may output a pressing completion signal indicating that the pressing operation is completed to the outside when the predetermined time has elapsed from the start of the pressing operation.

In a case where the operation signal is in the off state (step S109: YES), the position command output unit 111 outputs the position command value in which the origin position is the target position and starts the operation of moving the rod 5 upward (step S110). In a case where the rod 5 moves upward beyond the position switching from the thrust control to the position control, the speed limiter 113 and the current limiter 115 stop limiting the speed command value and the current command value. The control in which the limitation of the movement speed of the rod 5 and the thrust applied to the rod 5 is released is performed (step S111).

In a case where the switch from the thrust control to the position control is performed the position control unit 112 determines whether or not the rod 5 has reached the origin position (step S112) and waits until the rod 5 reaches a limitation position (step S112: NO). In a case where the rod 5 reaches the origin position (step S112: YES), the operation is ended. In a case where the operation is ended, the rod 5 is held at the origin position by the servo control by the control unit 100. In addition, the vertical axis driver 116 may change the proportional gain to the second proportional gain before step S110 and return the proportional gain to the first proportional gain after step S111.

In the control device 1 of the present embodiment, at the timing when the control for the linear motor is switched to the thrust control, the vertical axis driver 116 increases the proportional gain by switching the proportional gain from the first proportional gain to the second proportional gain. The current value of the current flowing through the linear motor is vibrated by increasing the proportional gain in the vertical axis driver 116. Therefore, although the sliding resistance temporarily increases and the force inhibiting the movement of the rod 5 or the like acts when the rod 5, the rod 7, and the suction pad 8 are moved with a small thrust, since thrust larger than the sliding resistance instantaneously occurs, the linear motor is possible to be stably operated without inhibiting the movement. Although the sliding resistance varies, it is possible to move the rod 5 without stopping, and it is possible to prevent the time required in the operation of picking up the work or pressing the work on the substrate from increasing.

In addition, the control device 1 of the present embodiment determines whether or not the pressing operation has started on the basis of the current value and the movement speed. In a case where it is determined whether or not the pressing operation is started on the basis of the current value corresponding to the thrust generated by the linear motor, there is a possibility that an incorrect determination in which the pressing operation is started before the pressure by the suction pad 8 is started may occur due to the oscillation of the current. Not only the current value but also the movement speed are used for the determination, and thus determination accuracy with respect to the start of the pressing operation is possible to improve. In addition, in the pressing operation, the vertical axis driver 116 is capable of causing the linear motor to perform a stable pressing operation by preventing the oscillation of the current.

Figure 4:
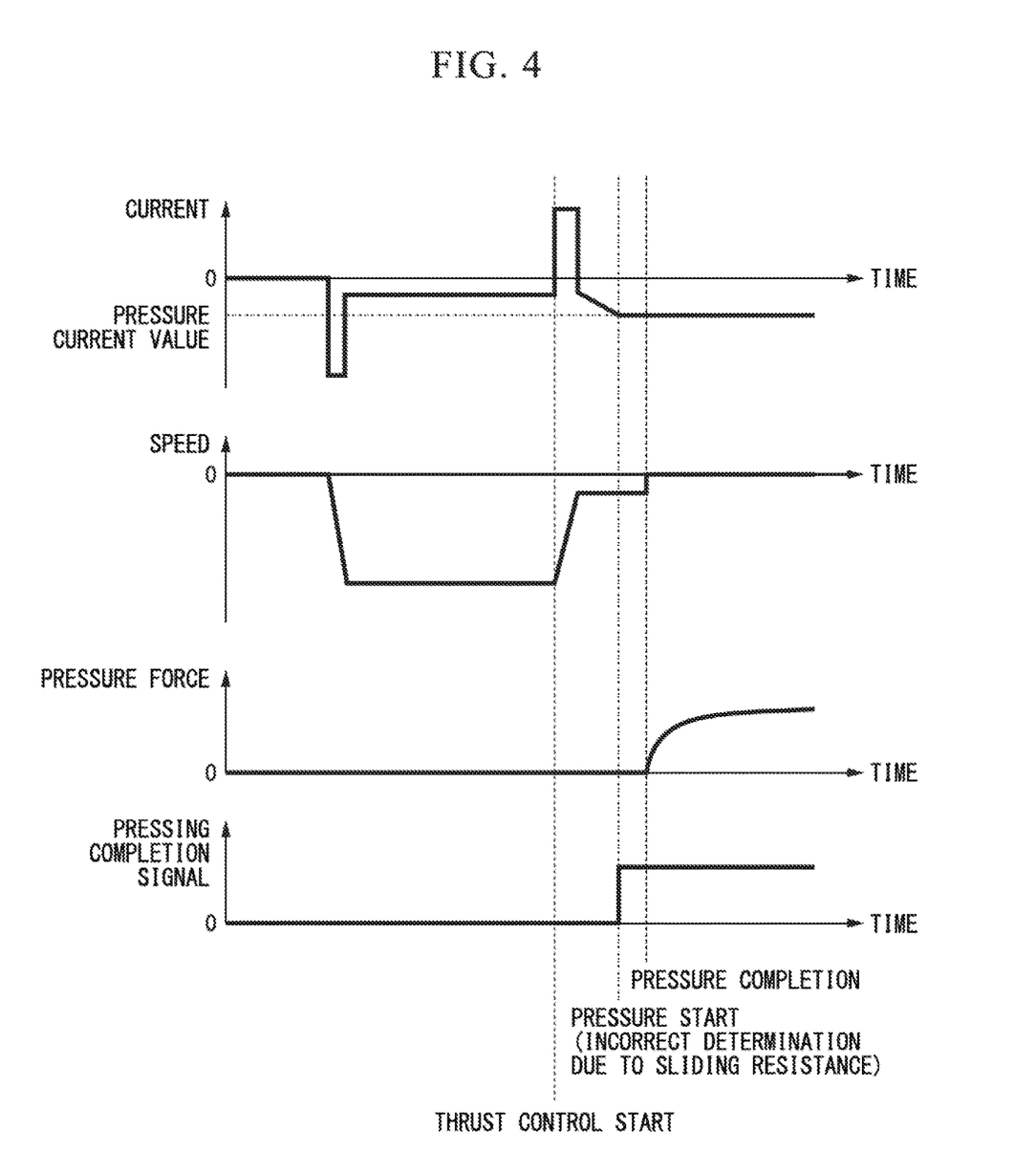
FIG. 4 is a diagram illustrating an operation example of the linear actuator in a first comparative example.
Figure 5:
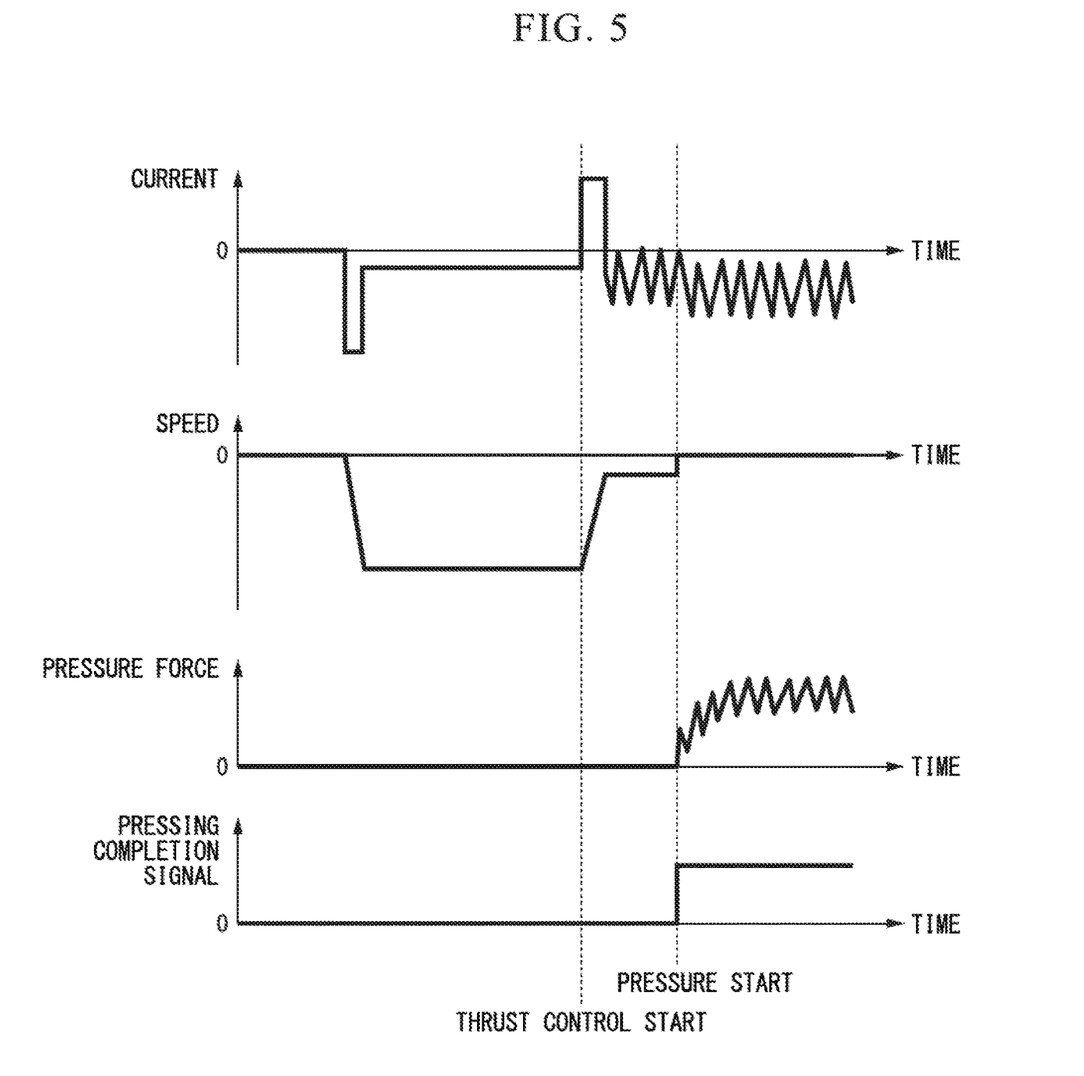
FIG. 5 is a diagram illustrating an operation example of the linear actuator in a second comparative example.
Figure 6:
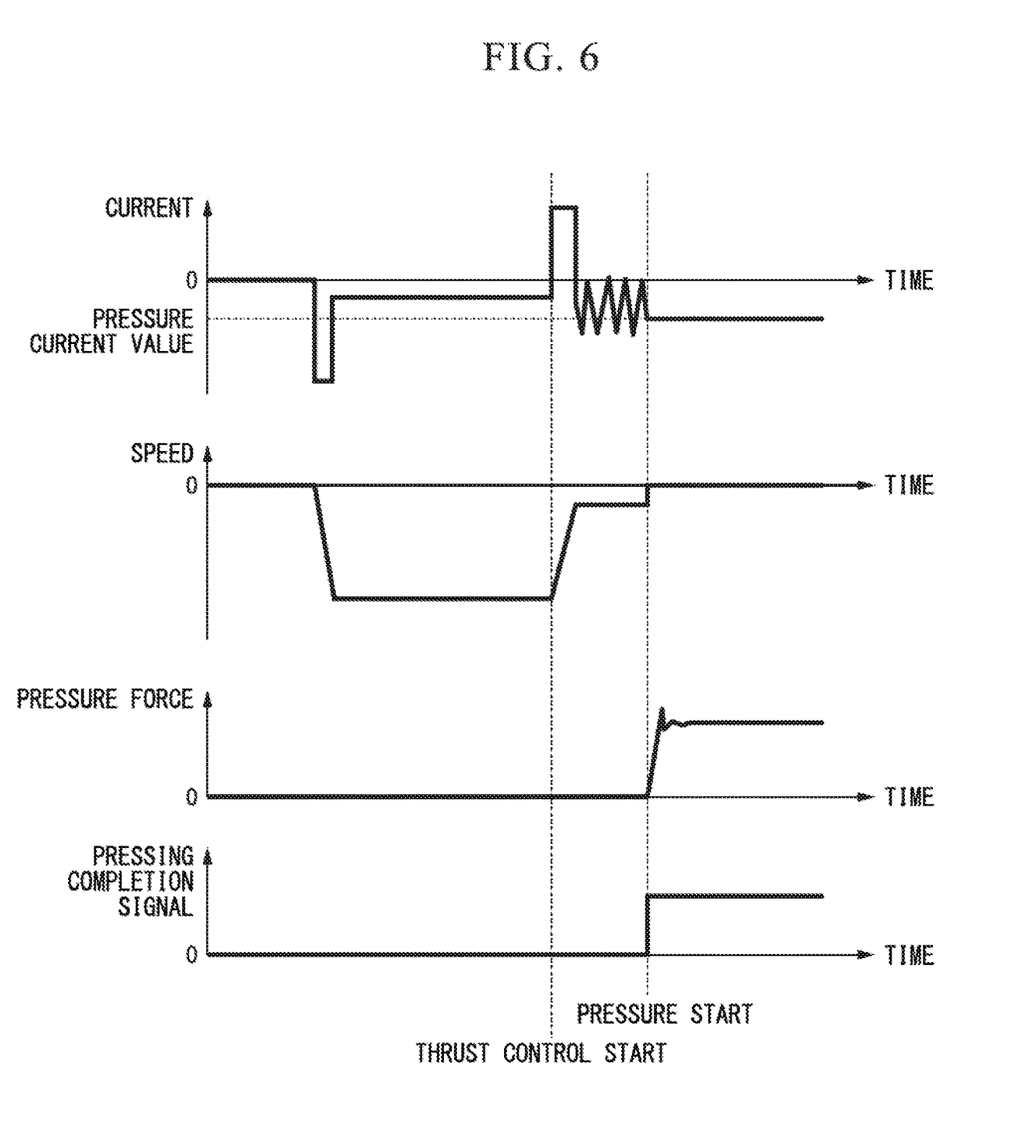
FIG. 6 is a diagram illustrating the operation example of the linear actuator in an embodiment of the present invention.

An operation example from the switch to the thrust control to the completion of the pressing operation in the linear actuator of the present embodiment will be described referring to FIGS. 4 to 6. In FIGS. 4 to 6, waveform diagrams indicating change over time of each of the current value of the current flowing through the linear motor, the speed at which the rod 5 moves, a pressure force at which the suction pad 8 presses the work, and the pressing completion signal indicating the completion of the pressing are shown. The pressure force is force measured by a load cell attached to the suction pad 8.

FIG. 4 is a diagram illustrating an operation example of the linear actuator in a first comparative example. In an operation of the first comparative example, the proportional gain is not switched like the vertical axis driver 116 of the present embodiment when the switch from the position control to the thrust control is performed. The rod 5 starts moving downward toward the pressing position in accordance with the operation signal. The movement speed of the rod 5 is reduced due to a start of thrust control at the switch position, and the rod 5 moved at the limited speed. In the movement of the rod 5 in the thrust control, as the result that the sliding resistance is temporarily increased at a certain position, the current value of the current flowing through the linear motor is temporarily increased and reaches the pressure current value, and an incorrect determination in which the suction pad 8 reaches the pressing position occurs.

However, the suction pad 8 reaches the pressing position at the point of time when the pressure force value thereafter starts to increase. In addition, in a case where the sliding resistance is greater than the thrust of the limited linear motor, the rod 5 may stop on the way. If there is variation in the sliding resistance, an erroneous determination may occur at the start of the pressing operation and there is a likelihood that sufficient pressing on the work will not be performed.

FIG. 5 is a diagram illustrating the operation example of the linear actuator in a second comparative example. In an operation of the second comparative example, in a case where the thrust control is started, the vertical axis driver 116 changes the proportional gain from the first proportional gain to the second proportional gain. However, the operation is an operation when the vertical axis driver 116 continues to use the second proportional gain without returning the proportional gain to the first proportional gain when the pressing operation is started. In the second comparative example, the vertical axis driver 116 changes the proportional gain to the second proportional gain in a case where the thrust control is started in the switch position to make ripples (pulsation) to occur in the current flowing through the linear motor to occur.

The thrust generated by the linear motor is a thrust oscillating about the thrust corresponding to the current command value. Although the sliding resistance is temporarily increased at a certain position when the rod 5 moves, a thrust which is greater than the sliding resistance may be obtained by causing a certain degree of oscillation in the thrust. Therefore, it is possible to move the rod 5 without stopping the rod 5. In the second comparative example, since the second proportional gain is continuously used even after the pressing operation is started, the ripples occur in the current also in the pressing operation. Therefore, since deviation occurs in the thrust even when the pressure is performed, time for raising the pressure force is required.

FIG. 6 is a diagram illustrating the operation example of the linear actuator in the present embodiment. In the present embodiment, similarly to the second comparative example, the vertical axis driver 116 changes the proportional gain to the second proportional gain, and thus a certain amount of ripples occurs in the thrust generated by the linear motor. Therefore, although the sliding resistance is temporarily increased at a certain position when the rod 5 moves, a thrust which is greater than the sliding resistance may be obtained, and thus it is possible to move the rod 5 without stopping the rod 5.

In addition, in the present embodiment, as described above, in a case where the pressing operation is started, the vertical axis driver 116 returns the proportional gain from the second proportional gain to the first proportional gain and drives the linear motor. In a case where the pressing operation is started, the ripples of the current flowing through the linear motor is stopped, by returning the proportional gain to the first proportional gain, and the current value is stabilized to the pressure current value. Since the current value is stabilized and thus the thrust generated by the linear motor is also stabilized, it is possible to rapidly start the pressure force.

As described above, according to the control device 1 of the present embodiment, it is possible to stably operate the linear motor, even in a case where force inhibiting the movement such as the sliding resistance of a movable portion acts when the linear motor is controlled by suppressing the thrust. In addition, in the linear actuator of the present embodiment, it is possible to stably operate the linear motor by the thrust control for generating small thrust even in a case where there is a variation in the sliding resistance in the large linear motor when a large linear motor which is capable of generating a thrust equal to or greater than a predetermined value is used.

In addition, in the present embodiment, a case where a direction in which the movable element of the linear motor provided at the linear motion device 2 moves is the vertical direction has been described. However, the direction in which the movable element of the linear motor moves is not limited to the vertical direction. Even in a case where the direction in which the movable element of the linear motor moves is the direction other than the vertical direction and the force inhibiting the movement such as the sliding resistance of the movable portion acts, according to the control device 1, it is possible to stably operate the linear motor in the control for suppressing the thrust.

In addition, the control device 1 described above may have a computer therein. In this case, procedures for processes performed by certain or all constituent elements provided at the control device 1 are stored in a computer-readable recording medium in the form of programs and processes of each functional unit are performed by the computer reading and executing the program. Here, as the computer-readable recording medium, there are a magnetic disk, a magneto-optical disc, a CD-ROM, a DVD-ROM, a semiconductor memory, and the like. In addition, the computer program may be distributed to the computer through a communication line and the computer receiving the distribution may execute the program.

In addition, the embodiments described above are illustrative and do not limit the scope of the present invention. These novel embodiments can be realized in various other forms, and various omissions, substitutions, and changes may be made without departing from the scope of the invention. The embodiments and modifications thereof are included in the scope or spirit of the present invention and in the appended claims and their equivalents.

INDUSTRIAL APPLICABILITY

This is applicable to applications where it is indispensable to operate a linear motor stably even when a force inhibiting movement such as a sliding resistance of a movable part acts due to controlling the linear motor while reducing the thrust.

REFERENCE SIGNS LIST

1 Control device
2 Linear motion device (linear motor)
115 Current limiter
116 Vertical axis driver

The invention claimed is:

1. A control device of a linear motor, comprising:
a current limiter configured to output one of a target current value calculated on the basis of a position of a movable element provided at the linear motor and a position command value, and a limit current command value for suppressing the target current value to be within a predetermined range as a current command value on the basis of the position of the movable element; and
a driver configured to stabilize a current value of a current flowing through the linear motor by applying a voltage to the linear motor on the basis of a value obtained by multiplying a difference between the current value of the current flowing through the linear motor and the current command value by a first proportional gain in a case where the target current value is output as the current command value, and the driver being further configured to create a continuous oscillation in the current flowing through the linear motor by applying the voltage to the linear motor on the basis of a value obtained by multiplying a difference between the current value of the current flowing through the linear motor and the limit current command value by a second proportional gain greater than the first proportional gain in a case where the limit current command value is output as the current command value.

2. The control device for the linear motor of claim 1, wherein the linear motor is used for pressing an object,
in a case where the limit current command value is output from the current limiter, the driver determines whether or not the pressure of the object is started based on the current value of the current flowing through the linear motor and a moving speed of the movable element, and
in a case where the driver determines that the pressure of the object is started, the driver applies the voltage obtained by multiplying the difference between the current value of the current flowing through the linear motor and the limit current command value by the first proportional gain to the linear motor.

3. The control device for the linear motor of claim 1, wherein the linear motor is used for pressing an object, and in a case where the pressure of the object is started, the driver changes the proportional gain from the second proportional gain to the first proportional gain and drives the linear motor by applying the voltage to the linear motor.

4. A control method performed by a control device of a linear motor, the control device including a current limiter configured to output one of a target current value calculated on the basis of a position of a movable element provided at the linear motor and a position command value, and a limit current command value for suppressing the target current value to be within a predetermined range as a current command value on the bask of the position of the movable element, the control method comprising:
a step of stabilizing a current value of a current flowing through the linear motor by applying a voltage to the linear motor on the basis of a value obtained by multiplying a difference between the current value of the current flowing through the linear motor and the current command value by a first proportional gain in a case where the target current value is output as the current command value, and creating a continuous oscillation in the current flowing through the linear motor by applying the voltage to the linear motor on the basis of a value obtained by multiplying a difference between the current value of the current flowing through the linear motor and the limit current command value by a second proportional gain greater than the first proportional gain in a case where the limit current command value is output as the current command value.

5. The control method according to claim 4, wherein the linear motor is used for pressing an object, the control method further comprising a step of changing the proportional gain from the second proportional gain to the first proportional gain and driving the linear motor by applying the voltage to the linear motor in a case where the pressure of the object is started.

* * * * *